(12) United States Patent
Jung et al.

(10) Patent No.: US 11,908,713 B2
(45) Date of Patent: Feb. 20, 2024

(54) SEMICONDUCTOR SUBSTRATE TREATMENT SYSTEM

(71) Applicant: Samsung Electronics Co., Ltd., Suwon-si (KR)

(72) Inventors: Daesung Jung, Pohang-si (KR); Kwangil Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 155 days.

(21) Appl. No.: 16/926,956

(22) Filed: Jul. 13, 2020

(65) Prior Publication Data

US 2021/0159101 A1 May 27, 2021

(30) Foreign Application Priority Data

Nov. 26, 2019 (KR) ........................ 10-2019-0153288

(51) Int. Cl.
*H01L 21/67* (2006.01)
*H01L 21/677* (2006.01)

(52) U.S. Cl.
CPC .. *H01L 21/67184* (2013.01); *H01L 21/67196* (2013.01); *H01L 21/67742* (2013.01)

(58) Field of Classification Search
None
See application file for complete search history.

(56) References Cited

U.S. PATENT DOCUMENTS

| | | | | |
|---|---|---|---|---|
| 4,677,704 A | * | 7/1987 | Huggins | A47L 13/40 15/1.51 |
| 5,565,179 A | * | 10/1996 | Douglas | B08B 6/00 422/906 |
| 6,004,625 A | * | 12/1999 | Ohshima | B05D 1/06 427/180 |
| 6,009,894 A | | 1/2000 | Trussart | |
| 8,608,422 B2 | | 12/2013 | Moriya et al. | |
| 10,115,614 B2 | | 10/2018 | Yamawaku et al. | |
| 2004/0016443 A1 | | 1/2004 | Sasaki | |

(Continued)

FOREIGN PATENT DOCUMENTS

| | | | | |
|---|---|---|---|---|
| EP | 386317 A | * | 9/1990 | ............. H01L 21/02 |
| JP | 3570612 B2 | | 9/2004 | |

(Continued)

*Primary Examiner* — Karla A Moore
(74) *Attorney, Agent, or Firm* — Harness, Dickey & Pierce, P.L.C.

(57) ABSTRACT

A semiconductor substrate treatment system includes: a chamber having an internal space defined by a first surface and a second surface of the chamber opposing each other, and a third surface of the chamber connected the first surface and the second surface; a transfer device in a central region of the internal space for transferring a semiconductor substrate; an ionizing device including first and second discharge devices on the second surface for emitting ions having a first polarity and a second polarity, respectively, to charge particles in the internal space with the first and second polarities, and a third discharge device disposed above the transfer device, and configured to emit ions having the first and second polarities together; and first and second dust collecting assemblies on the third surface, facing each other, and configured to collect charged particles by generating electric fields having different polarities.

14 Claims, 9 Drawing Sheets

(56) References Cited

U.S. PATENT DOCUMENTS

| | | | |
|---|---|---|---|
| 2005/0268408 A1* | 12/2005 | Chin | H01L 21/67748 15/301 |
| 2006/0011213 A1* | 1/2006 | Moriya | H01L 21/67028 134/1.1 |
| 2008/0067368 A1* | 3/2008 | Avery | H01L 21/67253 250/305 |
| 2010/0202093 A1* | 8/2010 | Yamawaku | H01L 21/67742 414/217.1 |
| 2011/0090612 A1* | 4/2011 | Oikawa | H01L 21/67017 361/226 |
| 2014/0007371 A1* | 1/2014 | Lu | H01L 22/12 15/347 |
| 2016/0256806 A1* | 9/2016 | Sanders | D01D 5/0007 |

FOREIGN PATENT DOCUMENTS

| | | |
|---|---|---|
| JP | 6214441 B2 | 10/2017 |
| KR | 20040010146 A | 1/2004 |
| KR | 100612421 B1 | 8/2006 |
| KR | 100618905 B1 | 8/2006 |
| KR | 100640186 B1 | 10/2006 |
| KR | 20160116457 A | 10/2016 |
| KR | 101804525 B1 | 1/2018 |

\* cited by examiner

SEMICONDUCTOR SUBSTRATE TREATMENT SYSTEM

CROSS-REFERENCE TO RELATED APPLICATION(S)

This application claims the benefit of the Korean Patent Application No. 10-2019-0153288, filed on Nov. 26, 2019 in the Korean Intellectual Property Office, the disclosure of which is incorporated herein by reference in its entirety.

BACKGROUND

1 Field

Inventive concepts relate to a semiconductor substrate treatment system.

2. Description of Related Art

Semiconductor manufacturing equipment may be operated in a clean room that maintains a very high clean state. However, fine particles may exist in an internal space of a semiconductor manufacturing equipment due to internal and external factors. As a degree of integration of semiconductor devices improves, and line widths thereof become finer, removing the fine particles becomes important.

SUMMARY

An aspect of some inventive concepts provides a semiconductor substrate treatment system capable of effectively removing fine particles in a chamber.

According to one embodiment, a semiconductor substrate treatment system includes: a chamber having an internal space defined by a first surface of the chamber, a second surface of the chamber thereabove and opposing the first surface, and a third surface of the chamber connected to the first surface and the second surface; a transfer device in a central region of the internal space, the transfer device configured to transfer a semiconductor substrate; an ionizing device; and a first dust collecting assembly and a second dust collecting assembly on the third surface and facing each other. The ionizing device includes a first discharge device and a second discharge device on the second surface and configured to emit ions having a first polarity and a second polarity, respectively. The second polarity is opposite the first polarity. The ionizing device is further configured to charge particles in the internal space with the first polarity and the second polarity. The ionizing device further includes a third discharge device above the transfer device and configured to emit the ions having the first and second polarities together to neutralize a charge generated on a surface of the transfer device. The first dust collecting assembly and the second dust collecting assembly are configured to collect the charged particles by generating electric fields having different polarities. The first dust collecting assembly and the second dust collecting assembly are adjacent to the first discharge device and the second discharge device, respectively. The first dust collecting assembly and the second dust collecting assembly have the second polarity and the first polarity, respectively.

According to one embodiment, a semiconductor substrate treatment system includes: a chamber; an ionizing device; a transfer device; and a first dust collecting assembly. The chamber has an internal space defined by a lower surface of the chamber, an upper surface of the chamber opposing the lower surface, a first side surface of the chamber and a second side surface of the chamber opposing each other and connected to the lower surface and the upper surface, and a third side surface of the chamber and a fourth side surface of the chamber adjacent to the first side surface and the second side surface and opposing each other. The chamber is configured to provide a transfer path for transferring a semiconductor substrate. The ionizing device is on the upper surface. The ionizing device includes a first region configured to emit cations, a second region configured to emit anions, and a third region configured to emit cations and anions together. The first region of the ionizing device is adjacent to the first side surface. The second region of the ionizing device is adjacent to the second side surface. The transfer device is below the third region and configured to transfer the semiconductor substrate. The first dust collecting assembly and the second dust collecting assembly are on the first side surface and the second side surface, respectively, and configured to generate an electric field having a negative polarity and an electric field having a positive polarity, respectively.

According to one embodiment, a semiconductor substrate treatment system includes: process chambers configured to perform a process on a semiconductor substrate; a transfer chamber between the process chambers and configured to provide a transfer path of the semiconductor substrate; a fan filter assembly; and a dust collecting device. The transfer chamber has an internal space defined by a first surface of the transfer chamber, a second surface of the transfer chamber disposed thereabove and opposing the first surface, and side surfaces of the transfer chamber connected to the first surface and the second surface and disposed between the process. The fan filter assembly is on the second surface and configured to provide an introduced laminar flow of gas in a first direction to the internal space. The dust collecting device is on at least one side surface of the side surfaces. The dust collecting device is configured to collect particles in the internal space by introducing the introduced laminar flow of gas and discharging airflow toward the first direction at a same flow rate as a flow rate of the introduced laminar flow of gas.

BRIEF DESCRIPTION OF DRAWINGS

The above and other aspects, features, and effects of inventive concepts will be more clearly understood from the following detailed description, taken in conjunction with the accompanying drawings, in which.

DETAILED DESCRIPTION

Hereinafter, example embodiments of inventive concepts will be described with reference to the accompanying drawings.

Figure 1:
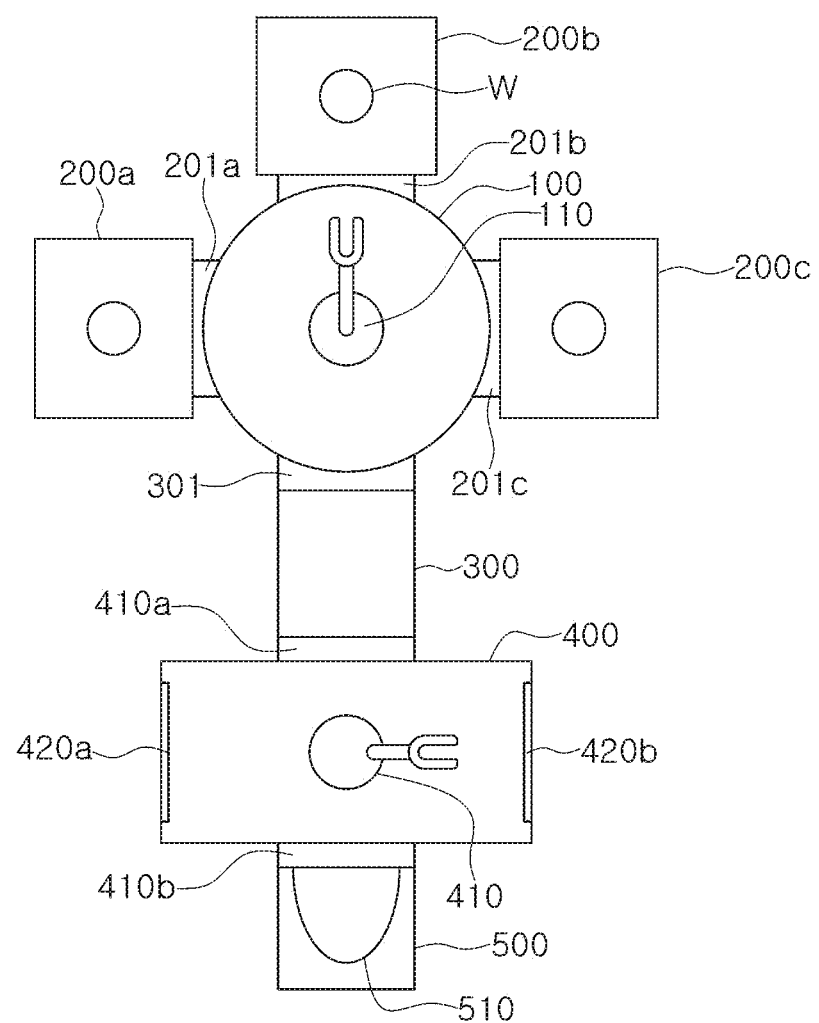
FIG. 1 is a plan view of a semiconductor substrate treatment system according to an embodiment of inventive concepts.
Figure 2:
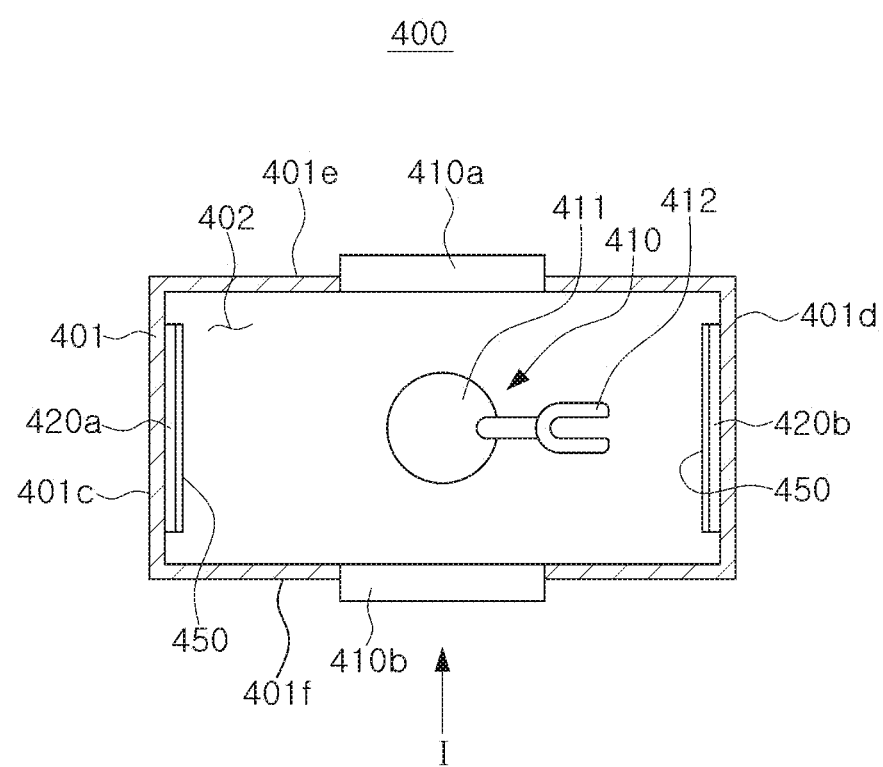
FIG. 2 is an enlarged view of the substrate transfer chamber of FIG. 1.
Figure 3:
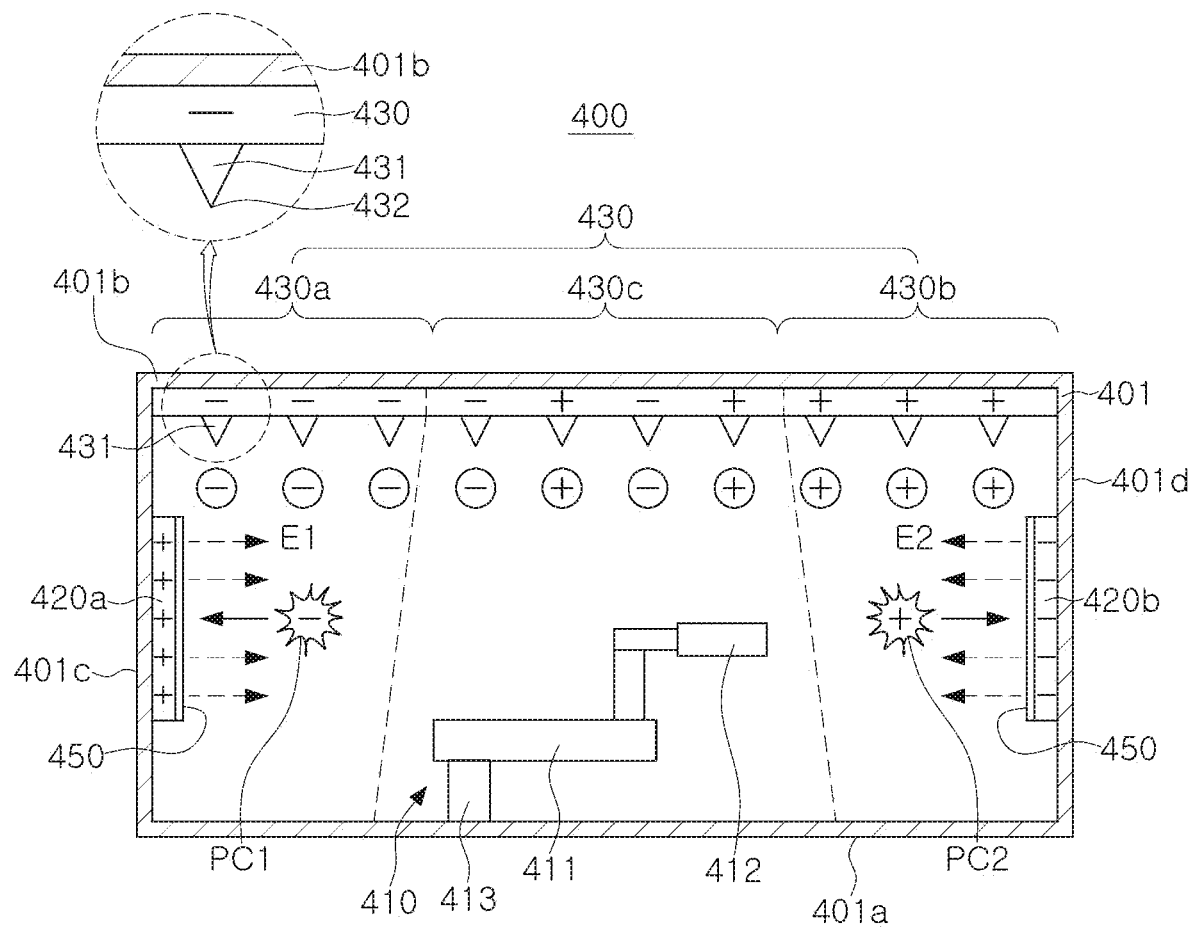
FIG. 3 is a side view of the substrate transfer chamber of FIG. 2 viewed in direction I of FIG. 2.

A semiconductor substrate treatment system according to an example embodiment of inventive concepts will be described with reference to FIGS. 1 to 3. FIG. 1 is a plan view of a semiconductor substrate treatment system according to an example embodiment of inventive concepts, FIG. 2 is an enlarged view of the substrate transfer chamber of FIG. 1, and FIG. 3 is a side surface view illustrating the substrate transfer chamber of FIG. 2 viewed in the direction I of FIG. 2.

Referring to FIG. 1, a semiconductor substrate treatment system 10 according to an example embodiment of inventive concepts may include process chambers 200a to 200c, a transfer chamber 100, a load lock chamber 300, a container 510, and a substrate transfer device 400.

The process chambers 200a to 200c may perform a desired and/or alternatively predetermined process on a semiconductor substrate such as a wafer W. For example, the process chambers 200a to 200c may perform processes such as chemical vapor deposition, etching, a photo, a cleaning process, and the like. A plurality of process chambers 200a to 200c may be disposed.

At least one of the process chambers 200a to 200c may be disposed at a next to (e.g., a periphery thereof, at a circumference thereof). In the transfer chamber 100, a transfer robot 110 may be disposed as a transfer device for loading and unloading the wafer W into the process chambers 200a to 200c.

The load lock chamber 300 is located between the substrate transfer device 400 and the transfer chamber 100, and may serve as a buffer on which wafers W to be loaded in to the process chambers 200a to 200c for progression and a buffer on which wafers W in which the process is completed temporarily remain. The load lock chamber 300 may alternately maintain an atmospheric pressure state and a vacuum state. A gate valve 301 may be disposed between the load lock chamber 300 and the transfer chamber 100.

A container 510 may load a plurality of wafers W in an internal space, and may be a sealed container having a door so that external air does not flow into the container 510. For example, a front opening unified pod (FOUP) may be used as the container 510. The container 510 may be disposed in a load port 500 of a substrate transfer device 400, and may be connected to the substrate transfer device 400 through a second door 410b.

Referring to FIGS. 1 and 2, the substrate transfer device 400 may be disposed between the container 510 and the load lock chamber 300, to transfer the wafer W loaded in the container 510 to the load lock chamber 300, and may load the wafer W waiting in the load lock chamber 300 to the container 510.

The substrate transfer device 400 may include a chamber 401, and a transfer robot 410 for moving the wafer W may be disposed in an internal space 402 defined by an outer wall of the chamber 401. The substrate transfer device 400 may be coupled to the load lock chamber 300 through a first door 410a, and may be coupled to the container 510 through a second door 410b. The first and second doors 410a and 410b may be gate valves. The substrate transfer device 400 may be an apparatus for an equipment front end module (EFEM).

In an example embodiment, the substrate transfer device 400 may include an ionizing device 430 and first and second dust collecting assemblies 420a and 420b, and may operate as a dust collector for removing particles from the internal space 402 and an ionizer in which static electricity is accumulated on the transfer robot 410 to limit and/or prevent generation of electrostatic discharge (ESD) on the wafer W. This will be described later.

Referring to FIGS. 2 and 3, the substrate transfer device 400 may have an internal space 402 defined by a chamber 401 having an upper surface 401b, a lower surface 401a, and side surfaces. In an example embodiment, the upper surface 401b and the lower surface 401a may have a quadrangular shape, and the side surfaces may include first to fourth side surfaces 401c to 401f in contact with edges of the upper surface 401b and the lower surface 401a, respectively.

The first side surface 401c and the second side surface 401d may be disposed to face each other, and the first door 410a and the second door 410b may be disposed on the first side surface 401c and the second side surface 401d, respectively. The first door 410a may provide a path connected to the load lock chamber 300, and the second door 410b may provide a passage connected to the container 510. In addition, the third side surface 401e and the fourth side surface 401f may be disposed to face each other, and may be disposed adjacent to the first side surface 401c and the second side surface 401d.

A transfer robot 410 for moving the wafer W may be disposed in the internal space 402. The transfer robot 410 may have a multi-stage arm 411, and an arm spoon 412 on which the wafer W is seated may be disposed in one end portion of the arm 411. The arm spoon 412 may be made of a thermally-nonconductive material to correspond to an equipment process environment, such as a high-temperature environment. A driving motor assembly 413 for driving the arm 411 may be disposed at the other end portion of the arm 411. When the second door 410b is opened, the transfer robot 410 may select a wafer that needs to be processed from the wafer W loaded in the container 510 to load it on the arm spoon 412. When the first door 410a is opened, the loaded wafer W may be transferred to the load lock chamber 300. In addition, the transfer robot 410 may receive the wafer W in which the process is completed in the process chambers 200a to 200c through the load lock chamber 300 and load the wafer W into the container 510. The arm spoon 412 may be disposed in parallel with a third region 430c of the ionizing device 430 in a rest state in which the wafer W is not transferred, such that static electricity may be removed by positive ions and negative ions emitted from the third region 430c. This will be described later. However, a structure of the transfer robot 410 is not limited thereto, and other transfer devices may be used for the substrate transfer device 400 instead of the transfer robot 410.

An ionizing device 430 emitting ions may be disposed on the upper surface 401b of the chamber 401. The ionizing device 430 may be disposed to entirely cover the upper surface 401b of the chamber 401, and a plurality of electrodes 431 including a cusp 432 that induce corona discharge may be disposed on the lower surface thereof. A DC power supply, an AC power supply, and a pulsed DC power supply may be connected to a plurality of electrodes 431 to apply various types of power supply to the plurality of electrodes 431. The plurality of electrodes 431 may be disposed to be spaced apart from each other at desired and/or alternatively predetermined intervals. The ionizing device 430 may have first to third regions 430a to 430c separated according to polarities of the emitted ions. The first to third regions 430a to 430c may be understood as first to third discharge devices, respectively. The first and second regions 430a and 430b may be disposed at both sides of the third region 430c, and the third region 430c may be disposed above the transfer robot 410.

The first and second regions 430a and 430b are regions in which only one kind of ions of cations and anions are emitted, respectively, and the third region 430c is a region in which cations and anions are emitted together. In an example embodiment, the first region 430a may be configured to emit anions, the second region 430b may be configured to emit cations, and the third region 430c may be configured to emit cations and anions together; however, inventive concepts are not limited thereto, and the cation may be emitted from the first region 430a and the anion may be emitted in the second region 430b. In addition, in the first region 430a and the second region 430b, cations and anions may be alternately emitted over time, but polarities of the ions emitted from the first region 430a and the second region 430b may be configured to be different from each other. For example, in the first region 430a, ions may emit in an order of cations, anions, cations . . . over time, and in the second region 430b, ions may emit in an order of anions, cations, anions . . . over time.

Figure 5:
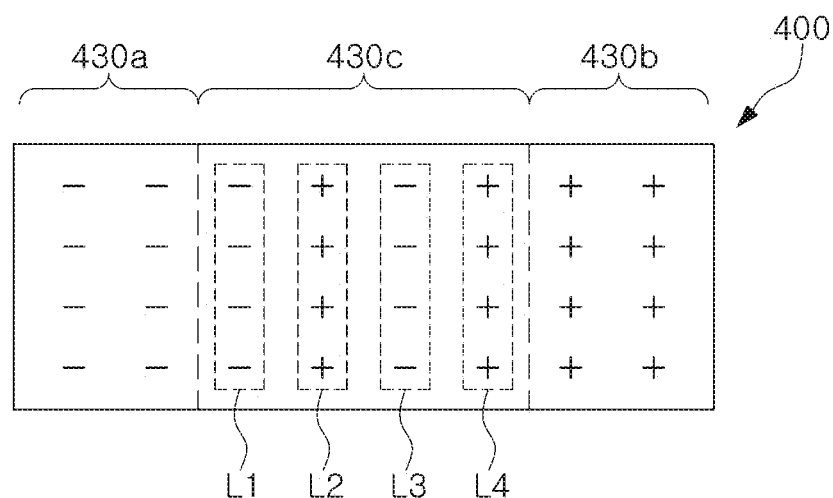
FIG. 5 is a plan view of the ionizer of FIG. 3.

FIG. 5 is a view of the ionizing device 430 viewed from above, and in FIG. 5, + and − means a position at which an electrode having a positive (+) polarity and an electrode having a negative (−) polarity are disposed, respectively. As shown in FIG. 5, the first and second regions 430a and 430b of the ionizing device 430 may be disposed at both sides of the third region 430c. In addition, in the first region 430a, the electrode of the negative polarity may be disposed, in the second region 430b, the electrode of the positive polarity, and in the third region 430c, the electrode having the negative polarity and the electrode having the positive polarity are disposed in rows L1 to L4, respectively, and in this case, the electrode having the negative polarity and the electrode having the positive polarity may be alternately disposed in a column direction. The electrode of the negative polarity and the electrode of the positive polarity of the third region 430c may be disposed in the same number so that an amount of anions and cations emitted to the lower portion of the third region 430c is substantially the same.

Figure 6:
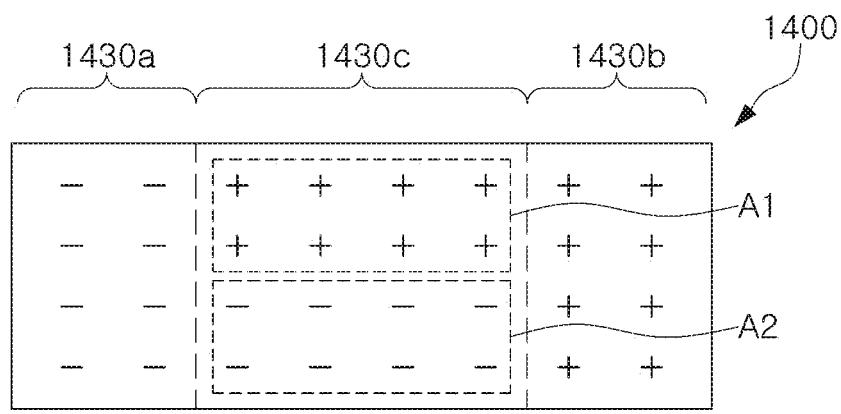
FIGS. 6 and 7 illustrate various modifications of the ionizer of FIG. 5.
Figure 7:
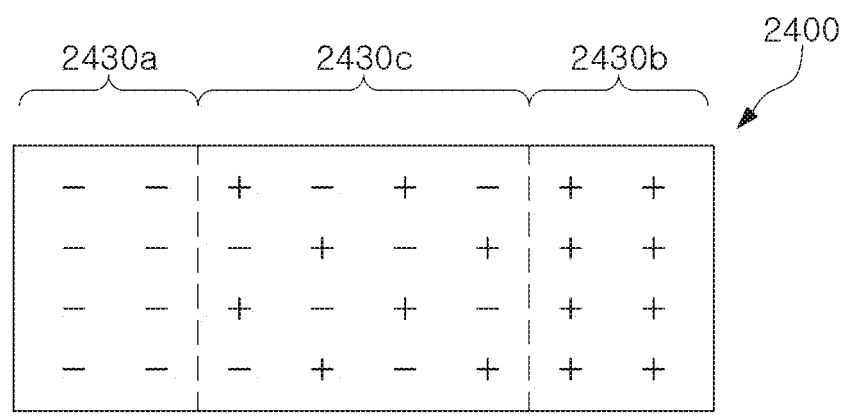

FIGS. 6 and 7 show examples in which a disposition of an electrode of a negative polarity and an electrode of a positive polarity of the third region is modified.

In an ionizing device 1400 of FIG. 6, an electrode disposition of a first region 1430a and a second region 1430b is the same as in the above-described example embodiment, but in a third region 1430c, there is a difference in that an electrode of a negative polarity and an electrode of a positive polarity are disposed in two regions A1 and A2 divided in a row direction.

In an ionizing device 2400 of FIG. 7, an electrode disposition of a first region 2430a and a second region 2430b is the same as in the above-described example embodiment, but in a third region 1430c, there is a difference in that an electrode of a negative polarity and an electrode of a positive polarity are alternately disposed in a row direction and a column direction, respectively.

The first and second regions 430a and 430b may discharge ions of one polarity to charge particles, to remove the charged particles through the first and second dust collecting assemblies 420a and 420b, and the third region 430c may be neutralized by removing static electricity charged on the surface of the transfer robot 410. This will be described in detail.

Many particles may be formed in the internal space 402 in a process of opening and closing the first and second doors 410a and 410b and in a process of transferring the wafer W by the transfer robot 410, and external particles may be introduced through a gap of the outer wall. When the particles are attached to the wafer, a problem in which the semiconductor process is not normally performed in the corresponding portion, and a defective chip is produced, may occur. In order to limit and/or prevent this, a process for cleaning the attached particles may be additionally performed. In general, since particles move under an influence of airflow, the particles can be removed by adjusting a direction of airflow. In addition, since the particles are stacked on the lower surface 401a of the chamber 401 under the influence of gravity, the particles may be removed by cleaning the lower surface 401a of the chamber 401. However, in the case of fine particles, smaller than micrometers (μm), the fine particles may tend to move irregularly regardless of airflow and gravity under an influence of Brownian motion. Therefore, with the conventional method of adjusting the direction of airflow or cleaning the lower surface 401a of the chamber 401, the fine particles cannot be effectively removed. The substrate transfer device 400 of an example embodiment may emit and charge ions to the fine particles, and collect the charged particles by applying an electric field having a polarity opposite to that of the charged polarity to the first and second dust collecting assemblies 420a and 420b.

In addition, when the transfer robot 410 transferring the wafer W in the internal space 402 of the substrate transfer device 400 or a surrounding environment are charged by static electricity, electrostatic discharge (ESD) may occur in the wafer W. In addition, unwanted problems in which particles are adsorbed onto the wafer W by electrostatic charging, the wafer W is stuck to an apparatus may occur. In particular, when the arm spoon 412 on which the wafer W is seated is charged, the wafer W may be damaged by ESD.

Figure 4A:
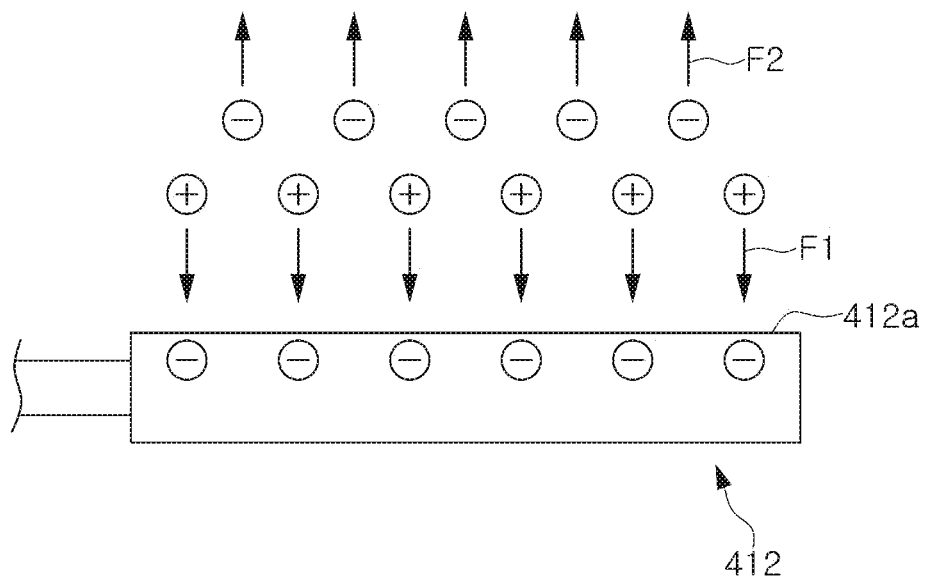
FIGS. 4A and 4B are views illustrating a process in which an arm of the transfer robot of FIG. 2 is neutralized.
Figure 4B:
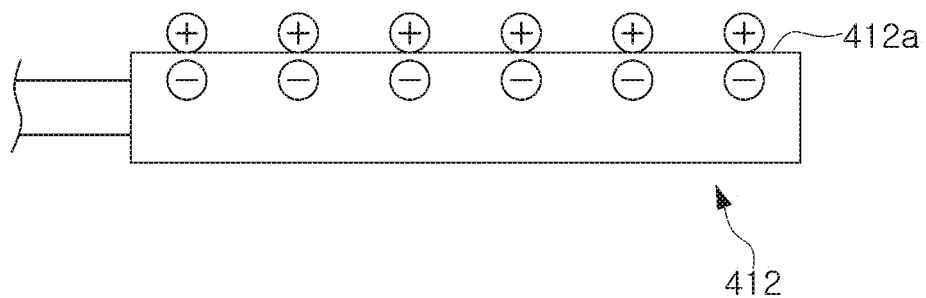

With reference to FIGS. 4A and 4B, this will be described. In FIG. 4A, when the surface 412a of the arm spoon 412 is charged with a negative charge, ions of positive polarities receive attraction force F1, and move to the surface 412a of the arm spoon 412, and ions of negative polarities receive repulsive force F2 by the negative charge of the surface 412a of the arm spoon 412, and move in a direction away from the surface 412a of the arm spoon 412. Therefore, as shown in FIG. 4B, the surface 412a of the arm spoon 412 is combined with the negative charge and the positive charge, thereby being neutralized. If the surface 412a of the arm spoon 412 has an opposite polarity, it is neutralized by an opposite phenomenon. In an example embodiment, an example in which the arm spoon 412 is neutralized is described, but is not limited thereto, and may be utilized to neutralize various nonconductors disposed in the internal space 402.

Therefore, the substrate transfer device 400 of an example embodiment may operate as a dust collector to remove particles of the internal space 402. In addition, the substrate transfer device 400 of an example embodiment may operate as an ionizer to limit and/or prevent electrostatic discharge (ESD) on the wafer W by accumulating static electricity on the transfer robot 410 or other electrostatic problems from being generated.

First and second dust collecting assemblies 420a and 420b for collecting the charged particles PC1 and PC2 may be disposed on the first and second side surfaces 401c and 401d of the chamber 401, respectively. The first and second dust collecting assemblies 420a and 420b may be disposed below the first and second regions 430a and 430b of the ionizing device 430, respectively, and may generate an electric field with a polarity different from that of ions emitted from the first and second regions 430a and 430b, respectively. That is, the first and second dust collecting assemblies 420a and 420b may be disposed adjacent to the first and second regions 430a and 430b, respectively, such that the particles charged by the ions emitted from the first and second regions 430a and 430b may receive attraction force by first and second electric fields E1 and E2 emitted from the first and second dust collecting assemblies 420a and 420b, according to their polarities. As a result, as shown in FIG. 3, the first particle PC1 charged with the negative polarity moves to a first dust collecting assembly 420a, and the second particle PC2 charged in the positive polarity moves to a second dust collecting assembly 420b, and they are collected. According to some example embodiments, a particle collecting layer 450 may be disposed on front surfaces of the first and second dust collecting assemblies 420a and 420b. The particle collecting layer 450 may be intended to limit and/or prevent contamination of the first and second dust collecting portions 420a and 420b and to maintain the particles firm when the particles are attached.

The particle collecting layer 450 may be formed of a porous thin film including a plurality of nanowires and/or a plurality of nanotubes arranged to cross each other to form a network structure. Therefore, the particles attached to the particle collecting layer 450 may remain attached to the surface of the particle collecting layer 450.

Figure 8:
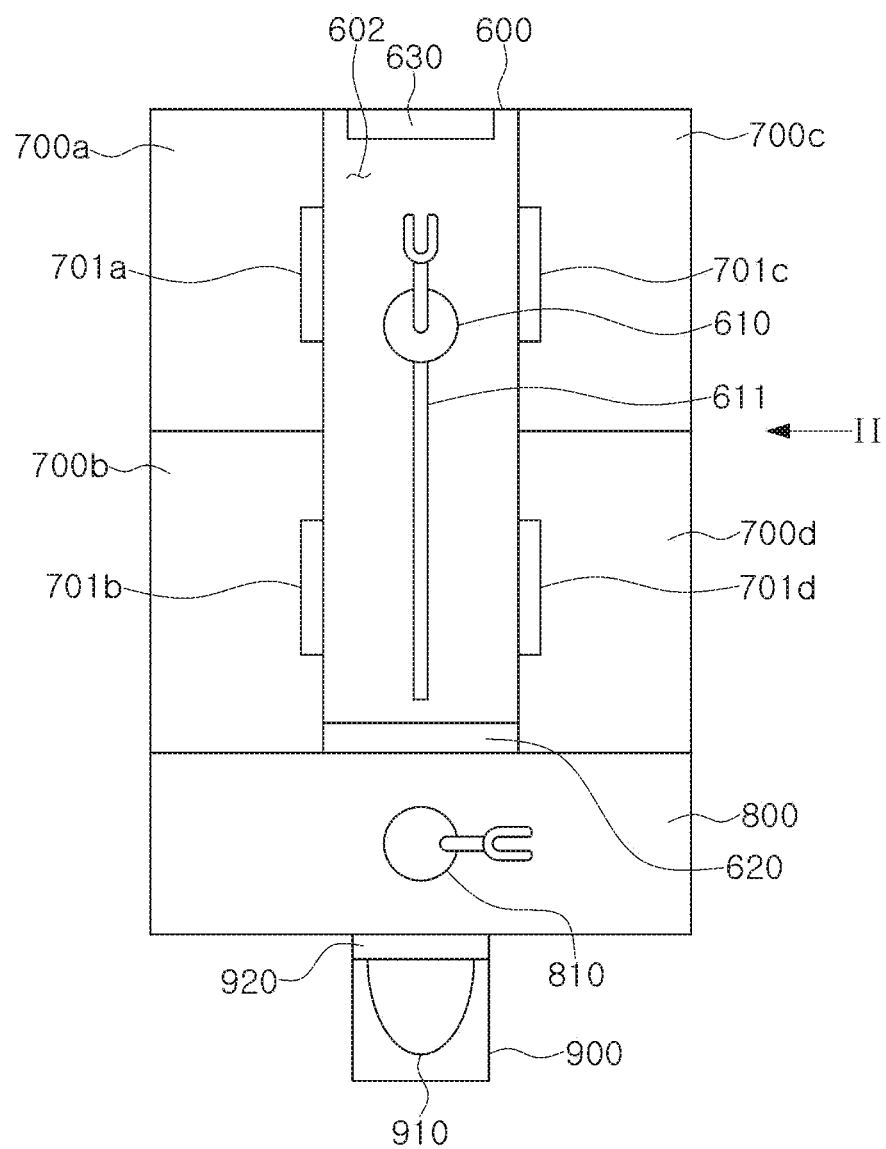
FIG. 8 is a plan view of a semiconductor substrate treatment system according to an embodiment of inventive concepts.

A semiconductor substrate treatment system according to an example embodiment of inventive concepts will be described with reference to FIGS. 8 to 10. FIG. 8 is a plan view of a semiconductor substrate treatment system according to an example embodiment of inventive concepts, FIG. 9 is a side surface view of the substrate transfer chamber of FIG. 8 viewed from direction II of FIG. 8, and FIG. 10 is a dust collecting device of FIG. 8, and FIG. 10 is a view of the dust collecting device of FIG. 9 viewed from the direction III of FIG. 9.

Referring to FIG. 8, a semiconductor substrate treatment system 20 according to an example embodiment may include process chambers 700a to 700d, a transfer chamber 600, a transfer robot 810, a container 910, a load port 900, and a substrate transfer device 800. Since the process chambers 700a to 700d, the transfer chamber 600, the transfer robot 810, the container 910, the load port 900, and the substrate transfer device 800 are the same as in those of the above-described example embodiment, redundant descriptions are omitted and the differences will mainly be described. In an example embodiment, a case in which the dust collecting device 630 is applied to the transfer chamber 600 has been described as an example, but is not limited thereto, and may be applied to various kinds of chambers.

In the transfer chamber 600, at least one process chamber 700a to 700d may be disposed at a circumference thereof, and in the internal space 602, a transfer robot 610 loading and unloading the wafer W in the process chambers 700a to 700d may be disposed as a transfer device. The transfer robot 610 may move the transfer chamber 600 on a rail 611. Gate valves 701a to 701d may be disposed between the process chambers 700a to 700d and the transfer chamber 600, and the gate valve 620 may also be disposed between the substrate transfer device 800 and the transfer chamber 600. Gate valves 701a to 701d may be disposed between the process chambers 700a to 700d and the transfer chamber 600, and the gate valve 620 may also be disposed between the substrate transfer device 800 and the transfer chamber 600. In addition, a gate valve 920 may also be disposed between the substrate transfer device 800 and the load port 900.

Figure 9:
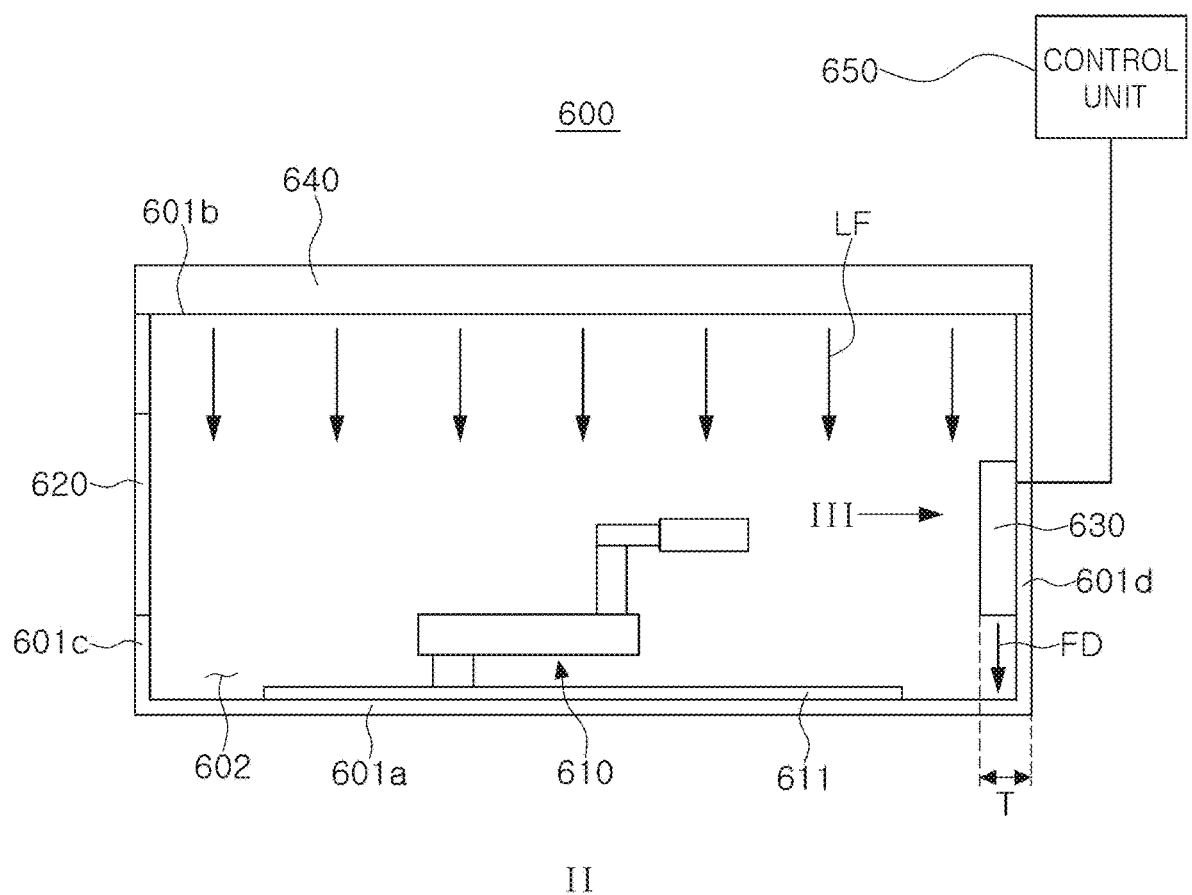
FIG. 9 is a side view of the substrate transfer chamber of FIG. 8 viewed in direction II of FIG. 8.
Figure 10:
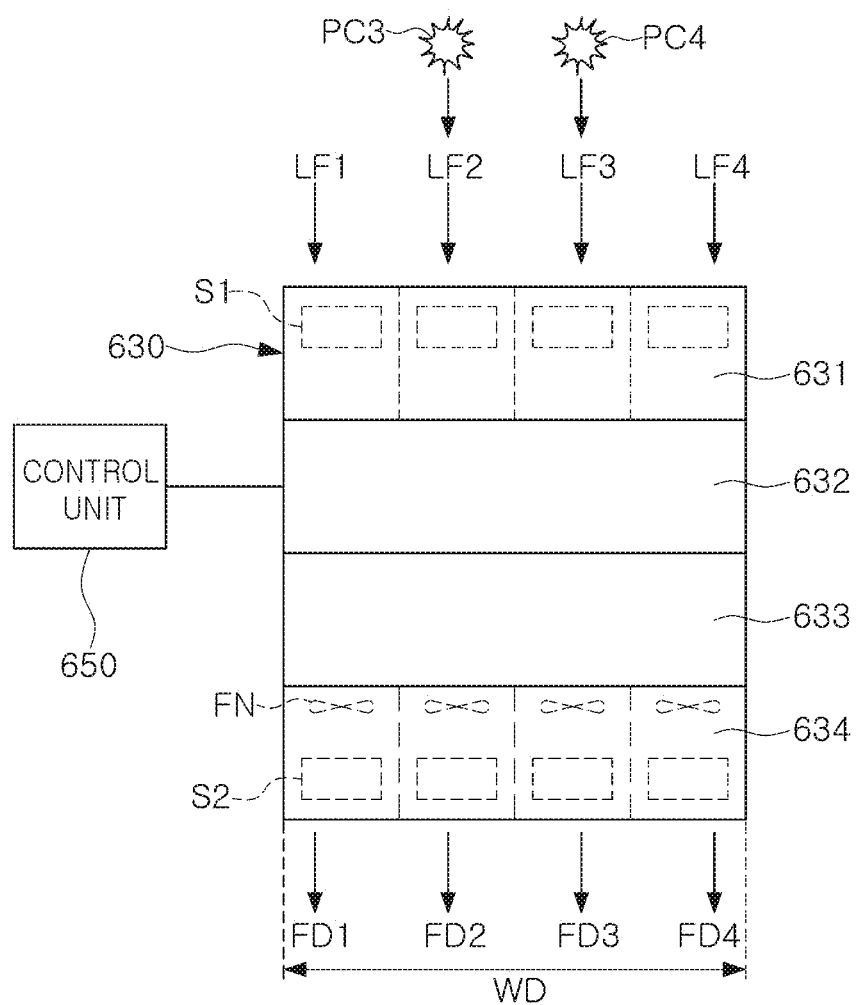
FIG. 10 is a view of the dust collector of FIG. 9 viewed in direction III of FIG. 9.

Referring to FIG. 9, a fan filter assembly 640 providing a laminar flow LF flowing toward the lower surface 601a thereof on the upper surface 601b of the transfer chamber 600 may be disposed. The laminar flow LF supplied by the fan filter assembly 640 has a flow in which stream lines do not cross each other from the upper surface 401b to the lower surface 401a of the chamber 401 and form a layer in one direction and flow regularly. The fan filter assembly 640 may include a fan, a filter, and power supply circuits, but is not limited thereto.

Referring to FIGS. 9 and 10, a dust collecting device 630 may be disposed. The gate valve 620 may be disposed on the other side wall 601c facing one side wall 601d. The dust collecting device 630 may have an appearance having a wide width WD and a small thickness T so that particles may be removed while suppressing a change in a flow of the laminar flow LF as much as possible. Due to this appearance, a removal of particles may be concentrated in the laminar flow LF near the side wall, but since the fine particles move irregularly under the influence of Brownian motion, a total amount of the fine particles in the internal space can be reduced as the dust collecting device 630 is operated. As a result of investigating the number of fine particles per a wafer in Example and Comparative Example in which a dust collecting device is not installed, it was investigated that in Comparative Example, 1.9 particles per a wafer are detected, whereas in the Example, 0.8 particles are detected. Therefore, it was confirmed that there is an effect that an amount of fine particles is reduced by 68%.

Referring to FIG. 10, a dust collecting device 630 may include a laminar flow inlet 631, an ion emitting device 632, a dust collecting assembly 633, an airflow discharge assembly 634, and a controller 650, and the laminar flow inlet 631, the ion emitting device 632, the dust collecting assembly 633, and the airflow discharge assembly 634 may be disposed in a direction of the laminar flow. The ion emitting device 632 may include a plasma electrode and/or an ionizing circuit, but inventive concepts are not limited thereto.

The controller 650 may be implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The controller 650 may operate in response to control signals, commands or instructions input thereto from an external source (e.g., host, not shown) a host (not shown). Accordingly, the controller 650 may control operations of the dust collecting device 630 discussed herein, thereby transforming the controller 650 into a special purpose controller 650. The controller 650 may improve the functioning of semiconductor substrate treatment system to facilitate removal of fine particles in a chamber.

The laminar flow inlet 631 is a portion into which the laminar flow is introduced, and fine particles PC3 and PC4 that irregularly move the internal space with the laminar flow may be introduced. Since the fine particles PC3 and PC4 are not affected by the flow of the laminar flow and move irregularly, the fine particles PC3 and PC4 may flow into the laminar flow inlet 631 at a desired and/or alternatively predetermined probability.

A first flow rate sensor S1 may be disposed into the laminar flow inlet 631. The first flow rate sensor S1 is for detecting a flow rate value of the introduced laminar flow, and one first flow rate sensor S1 may be disposed, but according to some example embodiments, as shown in FIG. 6, a plurality of first flow rate sensors S1 may be disposed along a width direction. Therefore, the flow rate values of the laminar flows LF1 to LF4 flowing into the respective regions of the laminar flow inlet 631 may be measured, respectively. The measured flow rate value may be transmitted to the controller 650, and the controller 650 may adjust the flow rate of the airflow blown by the airflow discharge assembly 634, with reference to the transmitted flow rate value. According to some example embodiments, the laminar flow inlet 631 may further include a pre-filter for adsorbing the introduced particles.

The ion emitting device 632 may be disposed below the laminar flow inlet 631, emit ions having a first polarity to the introduced laminar flow, thereby charging the introduced particles PC3 and PC4 together with the laminar flow to the first polarity.

The dust collecting assembly 633 may be disposed below the ion emitting device 632, and may collect the charged particles by generating an electric field having a second polarity, opposite to the first polarity of the charged particles.

The airflow discharge assembly 634 may be disposed below the dust collecting assembly 633, may include a fan FN and a second flow rate sensor S2, generate an airflow FD having the same flow rate as the flow rate of the laminar flow introduced into the laminar flow inlet 631, to blow it in the same direction as the laminar flow LF. One second flow rate sensor S2 may be disposed in the airflow discharge assembly 634, but according to example embodiments, a plurality of second flow rate sensors S2 may be disposed in a width WD direction, similar to the first flow rate sensor S1. Therefore, airflows FD1 to FD4 having the same flow rate as the flow rate values of the laminar flows LF1 to LF4 flowing into respective regions of the laminar flow inlet 631 may be discharged.

The controller 650 may control a rotation speed of the fan FN such that airflow having the same flow rate is formed in the airflow discharge assembly 634, with reference to the flow rate value measured by the first flow rate sensor S1. According to some example embodiments, the airflow discharge assembly 634 may further include a HEPA filter or a UPLA filter for adsorbing particles not collected in the dust collecting assembly 633.

The dust collecting device 630 according to an example embodiment having the structure as described above may collect fine particles while maintaining a direction of a laminar flow flowing through the internal space 602 of the transfer chamber 600.

As set forth above, according to inventive concepts, a semiconductor substrate treatment system can effectively remove fine particles in a chamber.

Various features and effects of the present disclosure are not limited to the above descriptions and may be easily understood in the course of describing example embodiments.

While example embodiments have been shown and described above, it will be apparent to those skilled in the art that modifications and variations could be made without departing from the scope of inventive concepts as defined by the appended claims.

What is claimed is:

1. A semiconductor substrate treatment system, comprising:
a chamber having an internal space defined by a first surface of the chamber, a second surface of the chamber thereabove and opposing the first surface, and a third surface of the chamber connected to the first surface and the second surface;
a transfer device in a central region of the internal space, the transfer device including an arm, the transfer device configured to transfer a semiconductor substrate;
an ionizing device including a plurality of discharge devices that each include an electrode,
the plurality of discharge devices including a first discharge device, a second discharge device, and a third discharge device,
the first discharge device and the second discharge device on the second surface and configured to emit ions having a first polarity and a second polarity, respectively,
the second polarity being opposite to the first polarity,
the ionizing device configured to charge particles in the internal space with the first polarity and the second polarity,
the third discharge device above the transfer device and configured to emit the ions having the first and second polarities together to neutralize a charge generated on a surface of the transfer device; and
a first dust collecting assembly and a second dust collecting assembly on the third surface and facing each other,
the first dust collecting assembly and the second dust collecting assembly being configured to collect charged particles by generating electric fields having different polarities,
the first dust collecting assembly and the second dust collecting assembly being adjacent to the first discharge device and the second discharge device, respectively, and
the first dust collecting assembly and the second dust collecting assembly having the second polarity and the first polarity, respectively, wherein
the first dust collecting assembly and the second dust collecting assembly include a particle collecting layer configured to have the charged particles attach thereto, and
the arm moves within an area corresponding to a lower portion of the third discharge device.

2. The semiconductor substrate treatment system of claim 1, wherein
the first discharge device, the second discharge device, and the third discharge device are disposed side by side with each other, and
the third discharge device is between the first discharge device and the second discharge device.

3. The semiconductor substrate treatment system of claim 1, wherein the electrode in the first discharge device, the electrode in the second discharge device, and the electrode in the third discharge device each comprise a cusp configured to induce discharge.

4. The semiconductor substrate treatment system of claim 3, wherein
the electrode of the third discharge device is one of a plurality of electrodes in the third discharge device,
among the plurality of electrodes in the third discharge device, a number of the plurality of electrodes configured to emit ions having the first polarity is the same as a number of the plurality of electrodes configured to emit ions having the second polarity.

5. The semiconductor substrate treatment system of claim 4, wherein
the third discharge device comprises a first region and a second region,
the plurality of electrodes in the first region are configured to emit ions having the first polarity, and
the plurality of electrodes in the second region are configured to emit ions having the second polarity.

6. The semiconductor substrate treatment system of claim 5, wherein the first region and the second region are alternately disposed side by side with respect to the second surface.

7. The semiconductor substrate treatment system of claim 3, wherein
the first discharge device, the second discharge device, and the third discharge device each comprise a plurality of electrodes spaced apart from each other at intervals,
the electrode of the first discharge device is one of the plurality of electrodes of the first discharge device,
the electrode of the second discharge device is one of the plurality of electrodes of the second discharge device, and
the electrode of the third discharge device is one of the plurality of electrodes of the third discharge device.

8. The semiconductor substrate treatment system of claim 1, wherein
the arm of the transfer device is a multi-stage arm,
the transfer device comprises an arm spoon,
the arm spoon is on one end of the multi-stage arm and configured to support the semiconductor substrate,
the arm spoon is formed of a nonconductor.

9. The semiconductor substrate treatment system of claim 8, wherein the arm spoon extends parallel with the lower portion of the third discharge device.

10. The semiconductor substrate treatment system of claim 1, wherein the ionizing device has an area corresponding to the second surface.

11. The semiconductor substrate treatment system of claim 1, wherein
the particle collecting layer includes a porous thin film, and
the porous thin film includes a network structure of at least one of a plurality of nanowires arranged to cross each other or a plurality of nanotubes arranged to cross each other.

12. A semiconductor substrate treatment system, comprising:
a chamber having an internal space defined by a lower surface of the chamber, an upper surface of the chamber opposing the lower surface, a first side surface of the chamber and a second side surface of the chamber opposing each other and connected to the lower surface and the upper surface, a third side surface of the chamber and a fourth side surface of the chamber adjacent to the first side surface and the second side surface,
the first side surface and the second side surface opposing each other,
the third side surface and the fourth side surface opposing each other,
the chamber configured to provide a transfer path for transferring a semiconductor substrate;
an ionizing device on the upper surface, the ionizing device including a plurality of regions that each include an electrode,
the plurality of regions of the ionizing device including a first region configured to emit cations, a second region configured to emit anions, and a third region configured to emit cations and anions together,
the first region of the ionizing device being adjacent to the first side surface, and
the second region of the ionizing device being adjacent to the second side surface;
a transfer device below the third region, the transfer device including an arm, the transfer device configured to transfer the semiconductor substrate; and
a first dust collecting assembly and a second dust collecting assembly on the first side surface and the second side surfaces, respectively,
the first dust collecting assembly and the second dust collecting assembly respectively configured to generate an electric field having a negative polarity and an electric field having a positive polarity, respectively, wherein
the first dust collecting assembly and the second dust collecting assembly each include a particle collecting layer,
the transfer path is arranged in a lower portion of the third region.

13. The semiconductor substrate treatment system of claim 12, wherein the electrode in the first region of the ionizing device, the electrode in the second region of the ionizing device, and the electrode in the third region of the ionizing device face the lower surface of the chamber and each include a cusp configured to induce discharge.

14. The semiconductor substrate treatment system of claim 13, wherein
the chamber includes a first door on the third side surface and a second door on the fourth side surface that are in fluid communication with the internal space,
the transfer device is configured to transfer the semiconductor substrate into the internal space or withdraw the semiconductor substrate from the internal space through the first door on the third side surface and the second door on the fourth side surface such that the transfer path is between the first door and the second door, and
the third region is on a path connecting the first door and the second door, and
the first region and the second region are disposed at both sides of the third region.

* * * * *